United States Patent
Volant et al.

(10) Patent No.: US 6,621,392 B1
(45) Date of Patent: Sep. 16, 2003

(54) MICRO ELECTROMECHANICAL SWITCH HAVING SELF-ALIGNED SPACERS

(75) Inventors: Richard P. Volant, New Fairfield, CT (US); David Angell, Poughkeepsie, NY (US); Donald F. Canaperi, Bridgewater, CT (US); Joseph T. Kocis, Pleasant Valley, NY (US); Kevin S. Petrarca, Newburgh, NY (US); Kenneth J. Stein, Sandy Hook, CT (US); William C. Wille, Red Hook, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/132,743

(22) Filed: Apr. 25, 2002

(51) Int. Cl.[7] .............................................. H01H 51/22
(52) U.S. Cl. .......................... 335/78; 439/48; 439/52; 361/281
(58) Field of Search ............................... 438/48–49, 52; 257/414, 421; 335/78; 200/181; 361/233, 277–281

(56) References Cited

U.S. PATENT DOCUMENTS

| | | |
|---|---|---|
| 5,454,904 A * | 10/1995 | Ghezzo et al. ........... 156/643.1 |
| 5,772,902 A | 6/1998 | Reed et al. |
| 5,880,921 A | 3/1999 | Tham et al. |
| 5,901,939 A | 5/1999 | Cabuz et al. |
| 5,970,315 A | 10/1999 | Carley et al. |
| 6,143,997 A | 11/2000 | Feng et al. |
| 6,160,230 A | 12/2000 | McMillan et al. |
| 6,534,331 B2 * | 3/2003 | Bennett et al. ............... 438/48 |

OTHER PUBLICATIONS

U.S. patent application Ser. No. 10/014,660, Volant et al., filed Nov. 7, 2001.

* cited by examiner

*Primary Examiner*—Lincoln Donovan
(74) *Attorney, Agent, or Firm*—H. Daniel Schnurmann

(57) ABSTRACT

A method of fabricating and the structure of a micro-electromechanical switch (MEMS) device provided with self-aligned spacers or bumps is described. The spacers are designed to have an optimum size and to be positioned such that they act as a detent mechanism for the switch to minimize problems caused by stiction. The spacers are fabricated using standard semiconductor techniques typically used for the manufacture of CMOS devices. The present method of fabricating these spacers requires no added depositions, no extra lithography steps, and no additional etching.

20 Claims, 9 Drawing Sheets

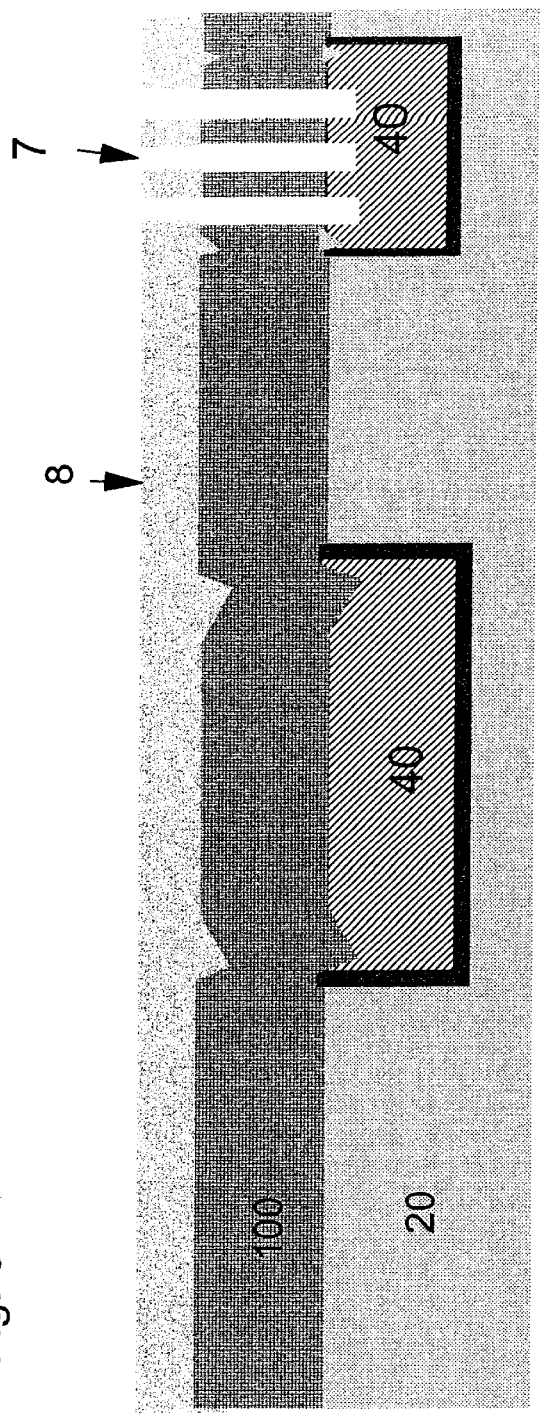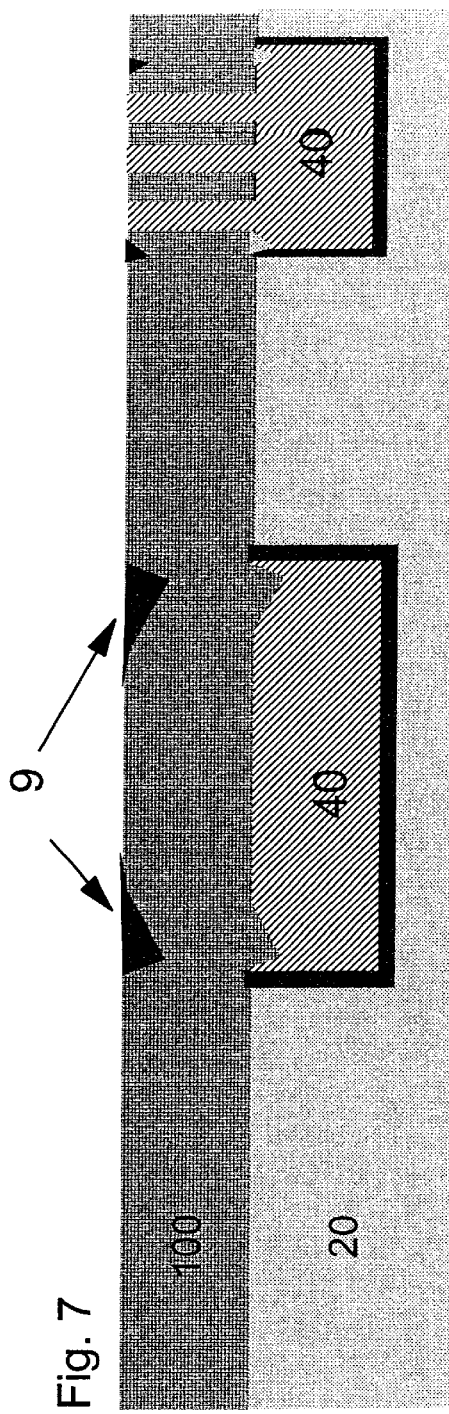

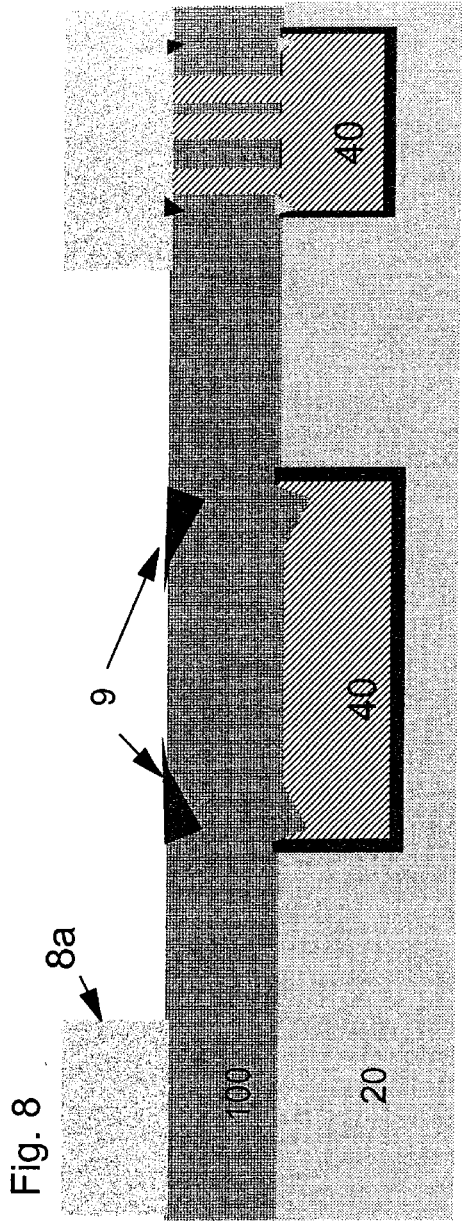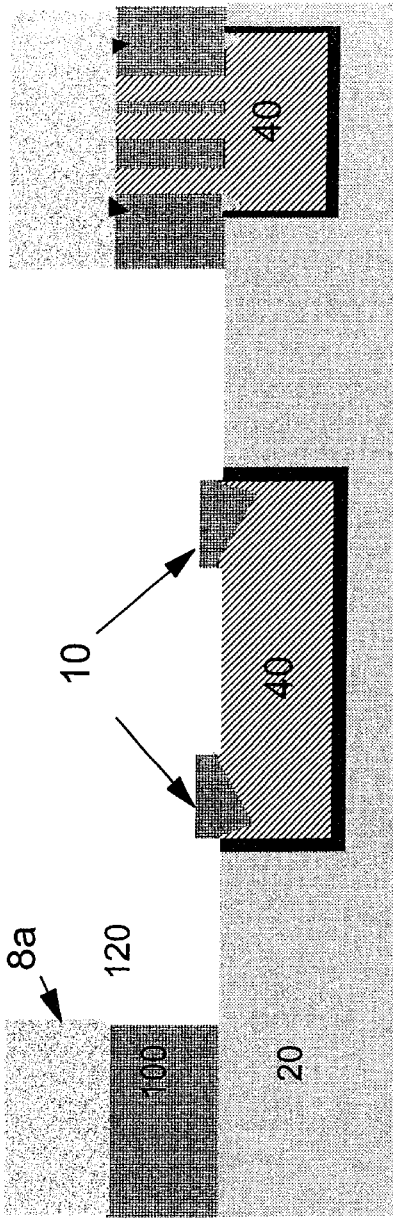

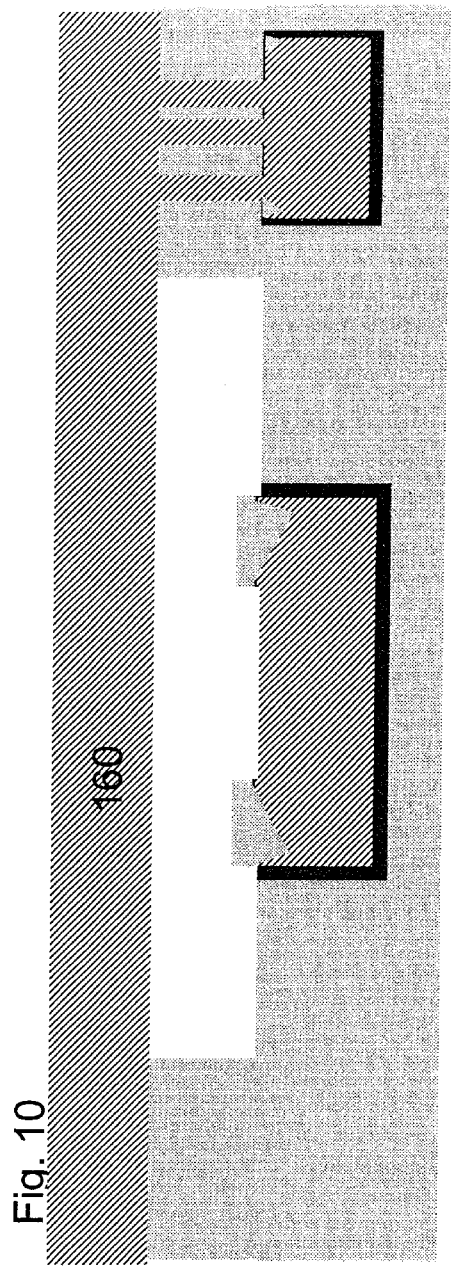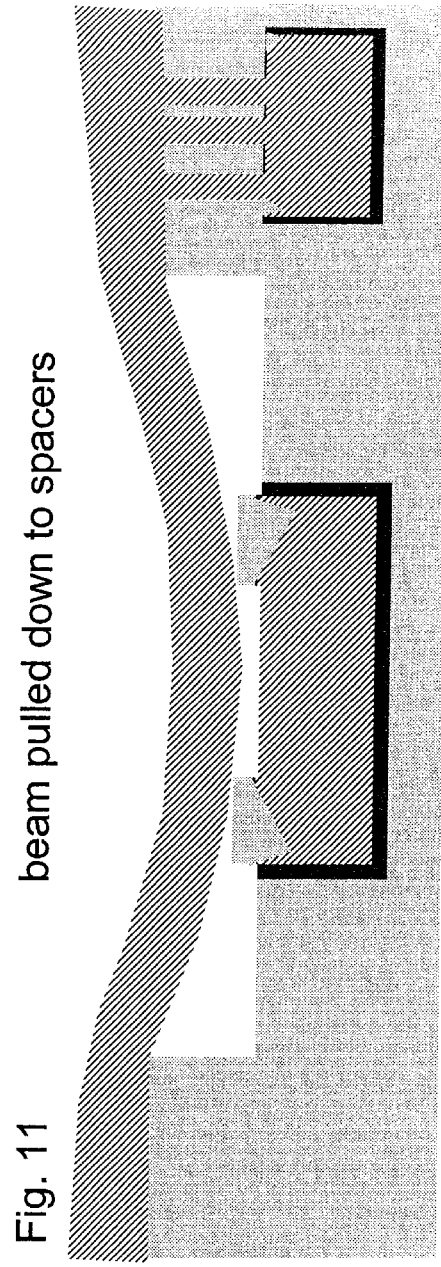
Fig. 10
Fig. 11 beam pulled down to spacers

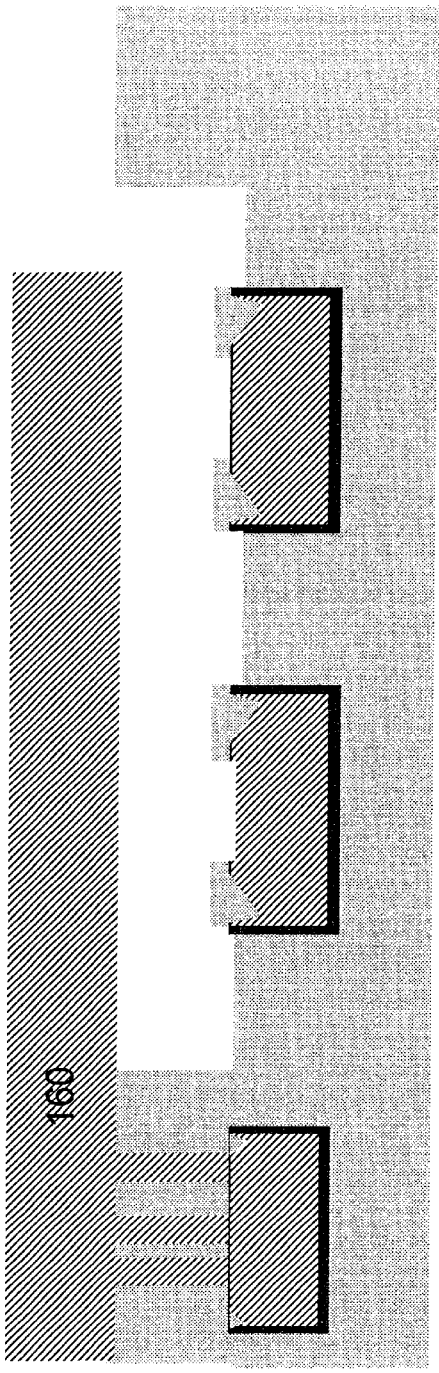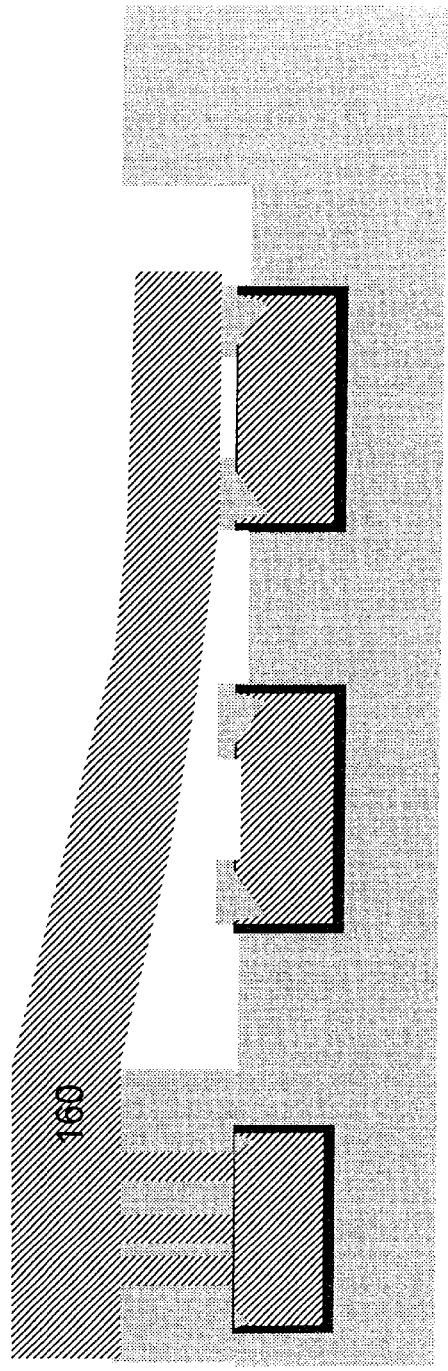

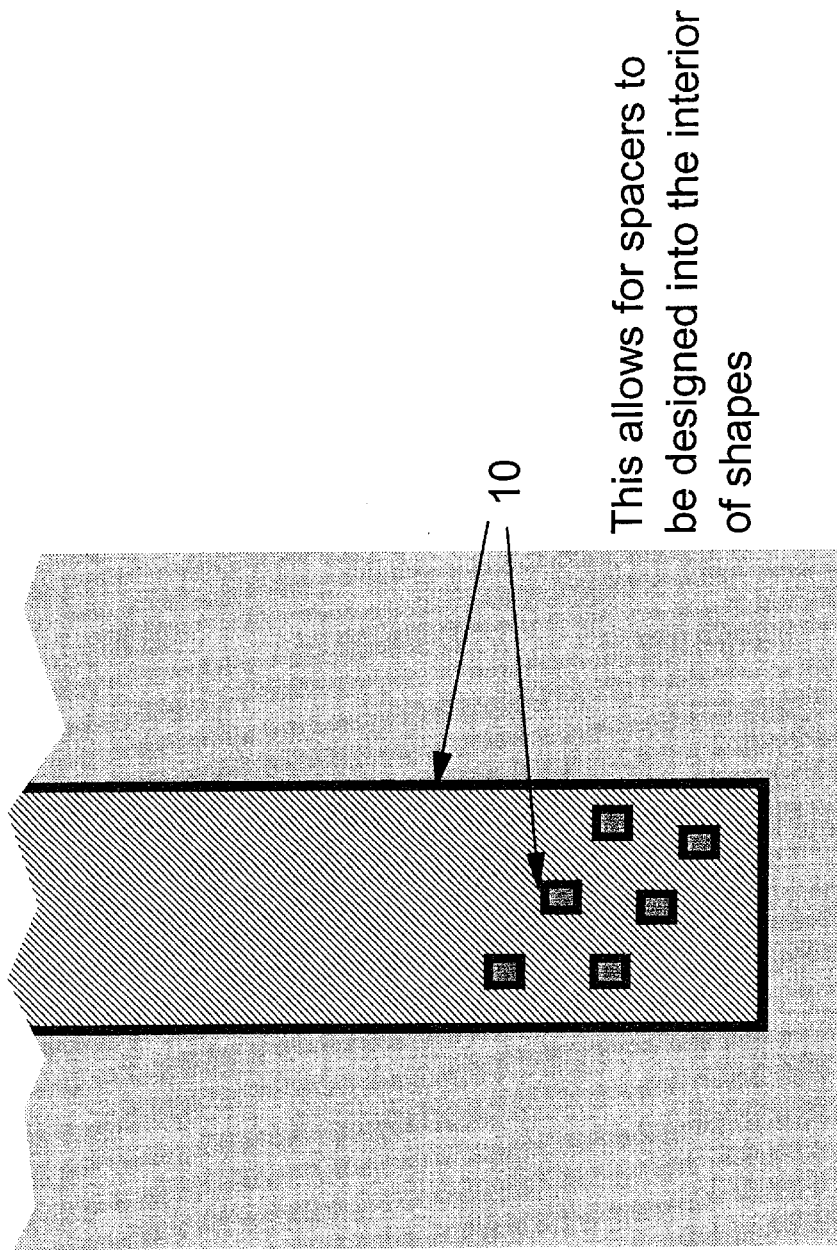

MICRO ELECTROMECHANICAL SWITCH HAVING SELF-ALIGNED SPACERS

FIELD OF THE INVENTION

This invention generally relates to the fabrication of micro-electromechanical switching (MEMS) devices that can be fully integrated into current state of the art semiconductor fabrication processes, and more particularly, for incorporating self-aligned spacers or stops to reduce stiction between a movable beam and an electrode.

BACKGROUND OF THE INVENTION

Switching operations are a fundamental part of many electrical, mechanical and electromechanical applications. MEM switches have drawn considerable interest over the last few years. Products using MEMS technology are widespread in biomedical, aerospace, and communications systems.

Conventional MEMS typically utilize cantilever switches, membrane switches, and tunable capacitor structures as described, e.g., in U.S. Pat. No. 6,160,230 to McMillan et al., U.S. Pat. No. 6,143,997 to Feng et al., U.S. Pat. No. 5,970,315 to Carley et al., and U.S. Pat. No. 5,880,921 to Tham et al. MEMS devices are manufactured using micro-electromechanical techniques and are used to control electrical, mechanical or optical signal flows. Such devices, however, present many problems because their structure and innate material properties require them to be fabricated in manufacturing lines that are separate from conventional semiconductor processing, particularly, CMOS. This is usually due to the different materials and processes that are incompatible and, consequently, not able to be integrated in standard semiconductor fabrication processes.

Materials that are typically used in the manufacture of MEMS, such as gold, pose obvious problems for integrating devices directly to on-chip applications. Even the use of polysilicon, which is widely found in the literature, poses problems to conventional fabrication facilities. One problem is that the polysilicon deposition process requires temperature cycles that are higher than the melting point of metals. Another problem is that polysilicon deposition tools are typically unavailable for use in the back-end of the line (BEOL), i.e., wherein interconnect metals are processed. This problem is mainly caused because the tool sets designated as front-end of the line (FEOL), i.e., where the actual semiconductor devices are fabricated, are segregated from all the tool sets designated for the back-end of the line (BEOL). The two sets do not permit process crossovers from one to the other in order to prevent metallic contamination of the active devices.

Accordingly, there is a need for a process that is capable of providing MEMS devices using established BEOL materials coupled to processing that can be fully integrated so that devices can be manufactured either in conjunction with or as an add-on module to the conventional BEOL or interconnect levels.

In order to gain a better understanding of the present invention, a conventional MEM switch will now be described with reference to FIG. 1, which shows a cross-section view of a MEM switch having both ends of a deformable beam 1 anchored in dielectric 4. The lowest level consists of a dielectric material 5 containing conductive elements 2, 2a, and 3 which will be used subsequently to connect or form the various electrical portions of the device. The conductors referenced by numerals 2 and 2a provide an operating potential that causes the beam to deform. Conductor 3, which conducts the electrical signals is, in turn, connected to the beam when it is in operation.

In a typical implementation, deformable beam 1 is formed by depositing polysilicon over dielectric 4, e.g., SiO2, and the surrounding material is etched away leaving a raised structure, i.e., the beam suspended above the conductors that were previously formed or which, themselves, are made of polysilicon. Then, the device is subjected to electroless plating, usually with gold, that adheres to the polysilicon forming the conductive elements 1, 2, 2a and 3. The switch operates by providing a potential difference between the beam and electrodes 2 and 2a. This voltage generates an electrostatic attraction that pulls beam 1 in contact with electrode 3, thus closing the switch.

FIG. 2 is a cross-section view and planar view respectively of another prior art MEM device similar to the devices shown in FIG. 1, except that only one end of the beam 1 anchored in the dielectric 4. Herein, the control electrode is referenced by numeral 2 and the switching electrode by numeral 3. This device is constructed and operates in a similar fashion to the one previously described.

When fabricating MEMS devices, it is desirable to introduce certain limitations or stops to inhibit movable parts from coming into contact with certain surfaces. It may also be required to prevent or limit the movement of certain switching elements or at least portions of these. This is the case illustrated in the accompanying drawings, within which are shown how stops are used to fabricate RF capacitive switches. The invention addresses these problems in detail, as will be explained hereinafter.

Another significant problem plaguing present art micro-electromechanical contact switches resides in the electrodes tending to stick to one another upon contact, making it difficult to separate them in order to turn the switch off. This phenomenon, known as "stiction" is caused by the attraction at the microscopic level between atoms and molecules on the two surfaces. One solution is to ensure that when one contact plate is deflected to close the switch, the deflection creates a spring-like restorative force that naturally attempts to separate the contacts. If large enough, such a force can overcome stiction. However, the same force also implies that a large force must be generated to deflect the contact to close the device. In a switch wherein the deflection is electrostatic, this generally implies the need for a high control voltage beyond the 5V maximum that is required in, for instance, mobile handsets.

The stiction problem is not novel, and certain aspects of it have been described in the art. By way of example, in U.S. Pat. No. 5,772,902 to Reed et al., there is described a method for preventing adhesion of micro-electromechanical structures sticking to each other during fabrication. The structure described therein applies to micro-electromechanical systems but not to stiction that occurs during the operation of the switches. More particularly, the patent describes a method for shaping parts to avoid stiction when the part is fabricated and released.

Other solutions to modifying the restoring force of a micro-electromechanical switch have been described in the patent literature as, for instance, in U.S. Pat. No. 5,901,939 to Cabuz et al., wherein the use of multiple control electrodes and a specially shaped beam to create a stronger restoring force are described. The technique described, however, requires driving multiple electrode pairs in a two-phase configuration, which adds to the cost and complexity of the system employing such a switch. In addition, rather than using a deflecting beam, this switch relies on shifting a buckled region of a metal line toward one end of the line or the other, a technique which generates large flexure of the line and which can generate long-term reliability concerns.

The problem created by stiction during a transition of the switch from the on to the off state has been mainly addressed by investigating such a behavior when it occurs only during the manufacturing process and not during post-production switch operation. Further, most solutions fail in that they do not provide a continued use of a simple, single control electrode or multiple electrodes, all of which are actuated with voltages that are approximately in phase. Moreover, existing solutions fail to introduce an additional restoring force to the deflecting beam by means of a simple electrode coating rather than by employing a new type of beam that is difficult to manufacture and which is normally energized by buckling rather than by deflection (thus introducing high material stresses which have reliability implications).

OBJECTS OF THE INVENTION

Thus, it is an object of the invention to provide self-aligned spacers or bumps such that they can act as a detent mechanism for some MEMS actuators.

It is another object to fabricate the self-aligned spacers by making them of the correct size, and further, to position them in the right places.

It is a further object to fabricate the spacers by way of standard semiconductor techniques, particularly, by fabrication methods that are typically used for the manufacture of CMOS devices.

It is still another object to ensure that the fabrication of the spacers requires no added depositions, no extra lithography steps, and no additional etching.

It is yet a further object to minimize the problem caused by stiction in MEMS devices.

SUMMARY OF THE INVENTION

To achieve these and other objects, and in view of its purposes, the invention provides self-aligned stops or spacers that are generated during the course of fabricating a MEMS device with no additional processes required. This is based on pre-forming the topography in a manner that initiates the later coincidental formation of these stops.

In one aspect of the invention, there is further provided a process of forming the self-aligned spacers. A metal damascene layer, preferably made of copper, and which is intended to be used as the lower functioning level of a MEMS device (i.e. switch) is first deposited. The layer is formed by depositing a suitable liner/barrier material such as TaN/Ta and a seed layer of Cu. Then the features are filled by Cu plating and the Cu and liner is then planarized. The copper is then subjected to an etchant. A wet etch consisting of water, acetic acid and hydrogen peroxide is advantageously used. The copper near the perimeters of the features etches faster than the bulk plated areas. This creates a differential topography around all metal features. The extent of the etch plays a role in how big the final spacer is to become. When the next layer of conformal dielectric material (e.g., SiO2) is deposited, the topography of the recessed perimeters is transferred to the top surface. As vias are constructed, the trenches fill with metal. The etch of the cavity for the MEMS device will now be influenced by the self-aligned metal filled trenches. For at least part of the etch, they will mask the corresponding areas below. This allows for at least some of the dielectric material to remain, thus forming the self-aligned spacers.

In another aspect of the invention there is provided a method of forming a micro-electro-mechanical switch (MEMS) that includes the steps of a) depositing a first dielectric layer on a substrate, the first dielectric layer having a plurality of conductive interconnect lines formed therein, b) wet etching metal to form trenches on the boundaries of the conductive interconnect lines; c) depositing a second dielectric layer through which conductive vias are formed the conductive vias contacting at least one of the plurality of conductive interconnect lines and replicating the trench topographies to the top surface of the second dielectric layer and filling with metal the replicated trench topographies; d) forming a cavity that is etched-out from the second dielectric layer and having the metal filled trench topographies selectively inhibit etching the dielectric underneath the metal trench topographies to form self-aligned spacers; e) filling the cavity with sacrificial material and planarizing the sacrificial material; and f) depositing a third dielectric layer to form a conductive beam with the conductive vias contacting the conductive beam.

Spacers may also be used to prevent shorting of plates in a MEM tunable capacitor. In this case, the dielectric bumps prevent the moveable plate from contacting the stationary plate, greatly extending the tunable range of the capacitor. For optical MEMS, they are also used to limit the tilting movement of a mirror or other membrane.

It is understood that both the foregoing general description and the following detailed description are exemplary, but are not restrictive of the invention.

BRIEF DESCRIPTION OF THE DRAWINGS

These and other objects, aspects, and advantages of the invention will be better understood by the description of preferred embodiments of the invention when taken in conjunction with the accompanying drawings. It is emphasized that, according to common practice, the various features are not drawn to scale; on the contrary, the dimensions of the various features are arbitrarily expanded or reduced for clarity. Included in the drawings are the following figures:

FIGS. 3 through 10 detail the process flow for constructing the self-aligned spacers as they relate to the MEM switching device, in accordance with one embodiment of the invention;

FIG. 11 illustrates how the self-aligned spacers affect the operation of the MEM switch;

FIG. 12 shows a MEMS device with only one end of the beam anchored;

FIG. 13 illustrates how the self-aligned spacers operate when the switch is activated;

FIG. 14 illustrates a MEMS configuration wherein additional self-aligned spacers have been incorporated within the main shape.

DETAILED DESCRIPTION OF THE INVENTION

The invention will next be illustrated with reference to the figures in which the same number indicates the same elements in all the figures. Such figures are intended to be illustrative rather than limiting, and are included to facilitate the explanation of the process of the present invention.

The invention provides a series of self-aligned spacers or bumps that act as a detent mechanism for MEMS actuators. An example would be by introducing spacers or stops in MEMS structures, as will be described hereinafter in the main body of the present invention. Yet, problems exist with fabricating these stops when attempting to making them of the correct size and positioned them in the right places. Both can be achieved with expensive and difficult depositions, lithography and etching. The main advantages of the inventive method is that it requires no added depositions, no extra lithography, and no added etching. Moreover, the availability of spacers or stops greatly reduces the probability of stiction in some devices.

To facilitate the understanding how to integrate the process in a semiconductor fabrication line, preferably adapted to manufacture CMOS devices, the patent application entitled "Method of Fabricating MEMS Switches on CMOS Compatible Substrates", Ser. No. 10/014,660, filed on Nov. 7, 2001, and of common assignee, is hereby incorporated by reference.

The preferred embodiment of the invention describes a method of constructing the self-aligned spacers in MEMS devices in a semiconductor CMOS manufacturing facility.

Figure 3:
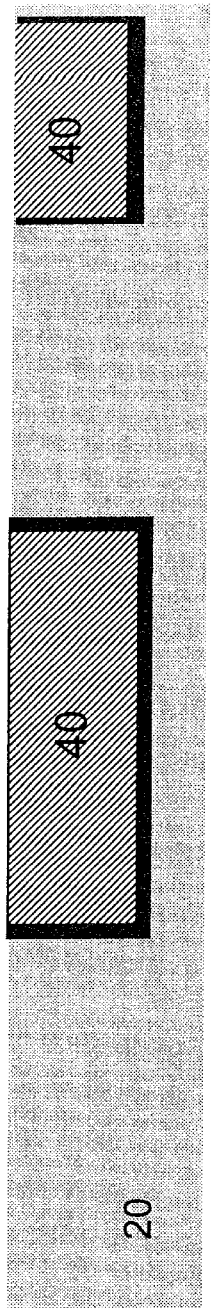

The starting structure, illustrated with reference to FIG. 3, can be recognized by those familiar with the art as a copper Damascene interconnect layer. Beneath this layer may be positioned other interconnect or via layers or devices such FETs, NPN transistors or HBTs, resistors, and the like, directly on the silicon substrate or, alternatively, on a low loss substrate such as quartz. The Damascene metal 40 embedded in dielectric 20 is preferably made of copper wiring embedded in a suitable dielectric material such as SiO2. The thickness of the metal is typically on the order of 3000 to 5000 Å, but it is not limited to this range.

Figure 4:
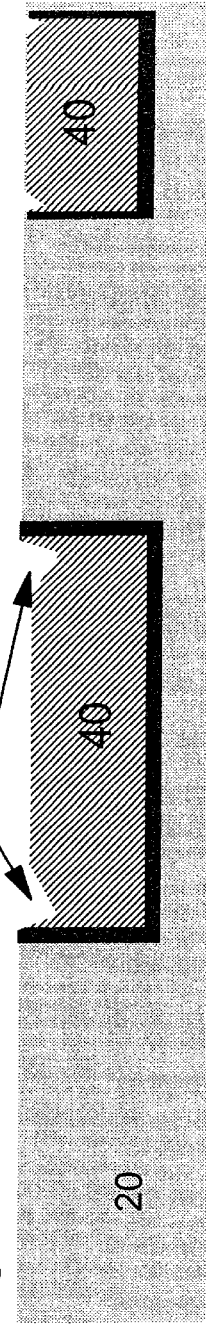

FIG. 4 shows the copper being recessed at the edges 5 using a wet etch, although other means are suitable. The extent of the recess depends upon the final structure desired. In the preferred method, the wet etch consists of a dilute solution of acetic acid and hydrogen peroxide. The copper is etched to a depth of about 800 Å.

It is worth noting that a key feature of the recess is achieved by aggressively removing the copper from around the perimeter of the structure, in view of grain boundaries setup between the seed layer and the plated copper. This also occurs around shapes within the main shape, as depicted hereinafter with reference to FIG. 14.

Figure 5:
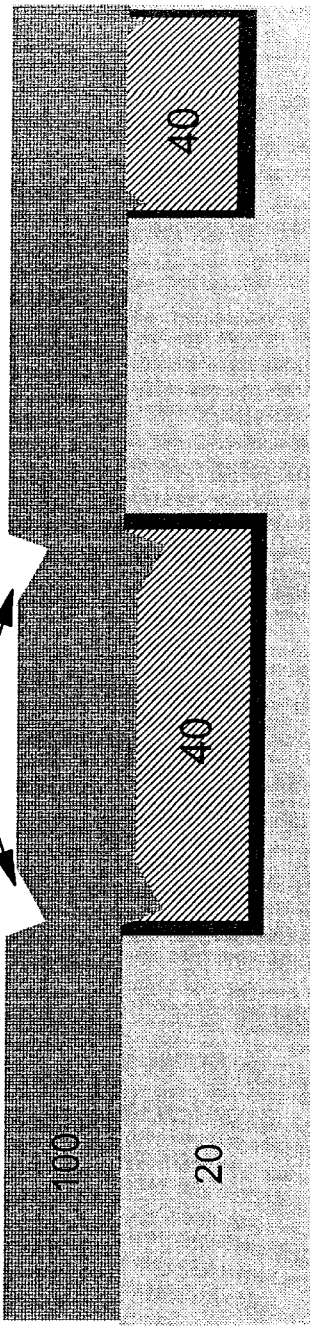

FIG. 5 shows the structure after depositing a conformal dielectric layer 100, such that the topography that was created below is now transferred to the top surface 6. The thickness of dielectric layer 100 depends on the depth of the cavity required. In the present embodiment, the preferred range varies between 800 and 5000 Å. Although the dielectric used in this case is $SiO_2$, practitioners in the art will readily recognize that any number of available dielectrics that are conformal can be used with equal success.

FIG. 6 illustrates the patterning and etching of vias 7 with photoresist 8. This is a standard lithographic and RIE process. The vias establishes interconnections between the various metal layers.

In FIG. 7, the vias are shown filled with metal using standard CMOS processing techniques, preferably, a single Damascene copper process. The structure is now planarized using a chemical-mechanical planarization (CMP) process, leaving metal 9, i.e., the liner, in the recesses that were formed earlier. The liner material of preference is TaN/Ta, but other liner materials may be used, such as Ti, TiN or Tungsten, as long as they mask the etch to be utilized hereinafter. What matters is that the recesses remain filled with metal after the planarization process is done properly, i.e., by avoiding that too much dielectric is removed.

FIG. 8 shows the patterning of a cavity formed in dielectric 100 using photoresist 8a. The self-aligned metal masking 9 is exposed in areas where the self-aligned spacers are to be fabricated.

FIG. 9 illustrates the etched cavity 120 with the self-aligned spacers which were formed by the metal masking (9 in FIG. 8). Metal 9 blocks the RIE of the dielectric for at least a portion of the etch, thus forming corresponding dielectric spacers 10 directly underneath metal 9. The height of the spacers thus depends upon the thickness of the dielectric and its etch time. It also depends on the thickness of the metal masking, all of which are tailored for the desired size of the spacers. By way of example, if the edges of the metal are recessed by about 700 to 900 Å. With a dielectric 100 defining the cavity of the order of about 1200 Å thick, the spacers ends up with a height approximately equal to 600 Å.

Figure 1:
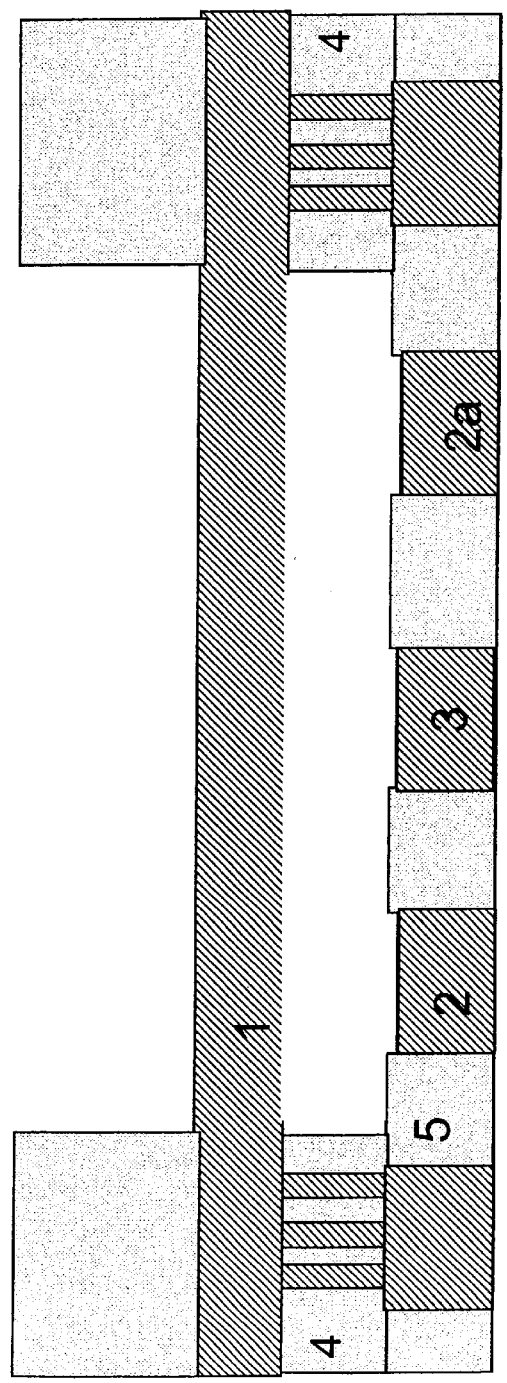
FIG. 1 is a cross-section view of a prior art MEM switch with both ends of the beam anchored seen along the length of the beam.
Figure 2:
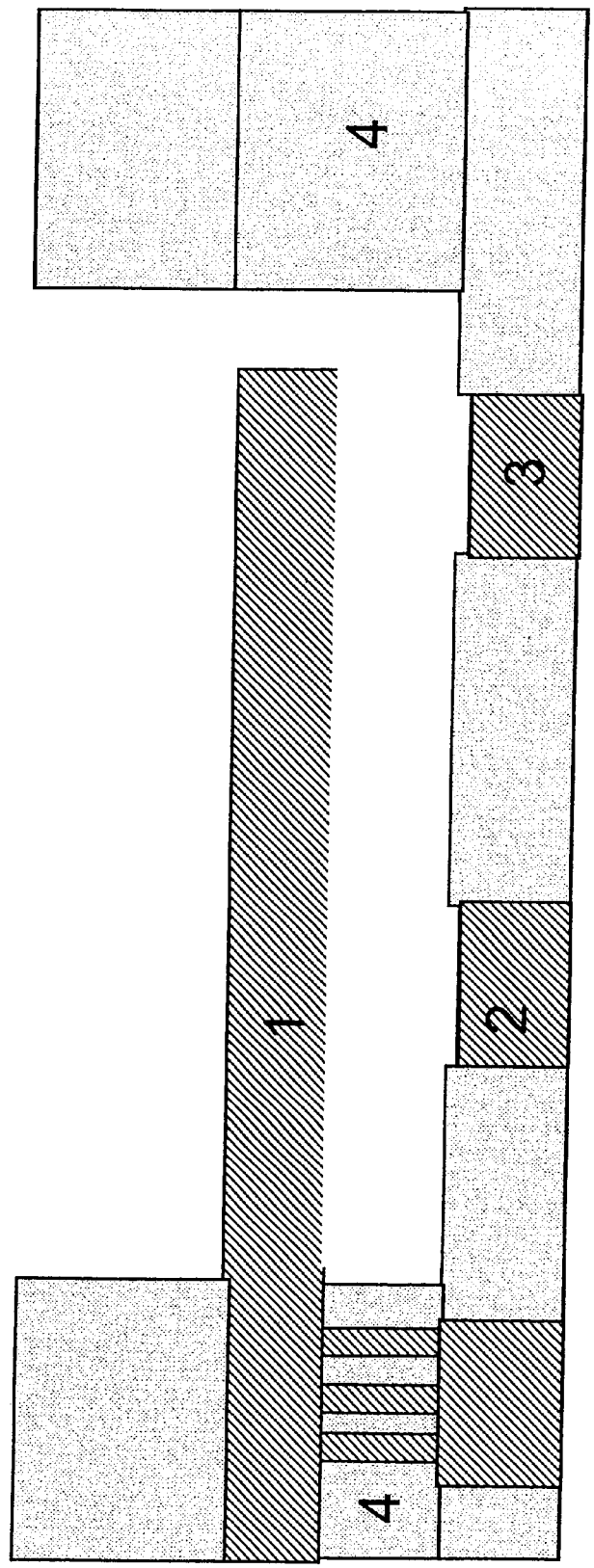
FIG. 2 is a cross-section view of a prior art MEM switch having only one end of the beam anchored.

FIG. 10 shows the completed structure with moveable beam 160 spanning across the cavity. Details of the method of manufacturing such a structure is described in detail in the aforementioned patent application entitled "Method of Fabricating MEMS Switches on CMOS Compatible Substrates", Ser. No. 10/014,660, filed on Nov. 7, 2001, hereby incorporated by reference. As shown in FIG. 2, other MEM switch configurations are possible, such as a SPST (single-pole, single-throw) switch, a DPDT (double-pole, double-throw) switch, and other multiple beam configurations.

FIG. 11 illustrates the beam activated electrostatically and bent to a point where it makes contacts with the self-aligned stops or spacers. Practitioners in the art will fully realize that the spacers can be used advantageously also to limit the bending of the MEMS actuators, minimizing contact between the movable beam and the metal electrode. By doing so, the problem of stiction is significantly minimized.

FIG. 12 shows a MEMS device with only one end of the beam anchored and FIG. 13 illustrates how the self-aligned spacers operate when the switch is activated as previously described.

Figure 15:
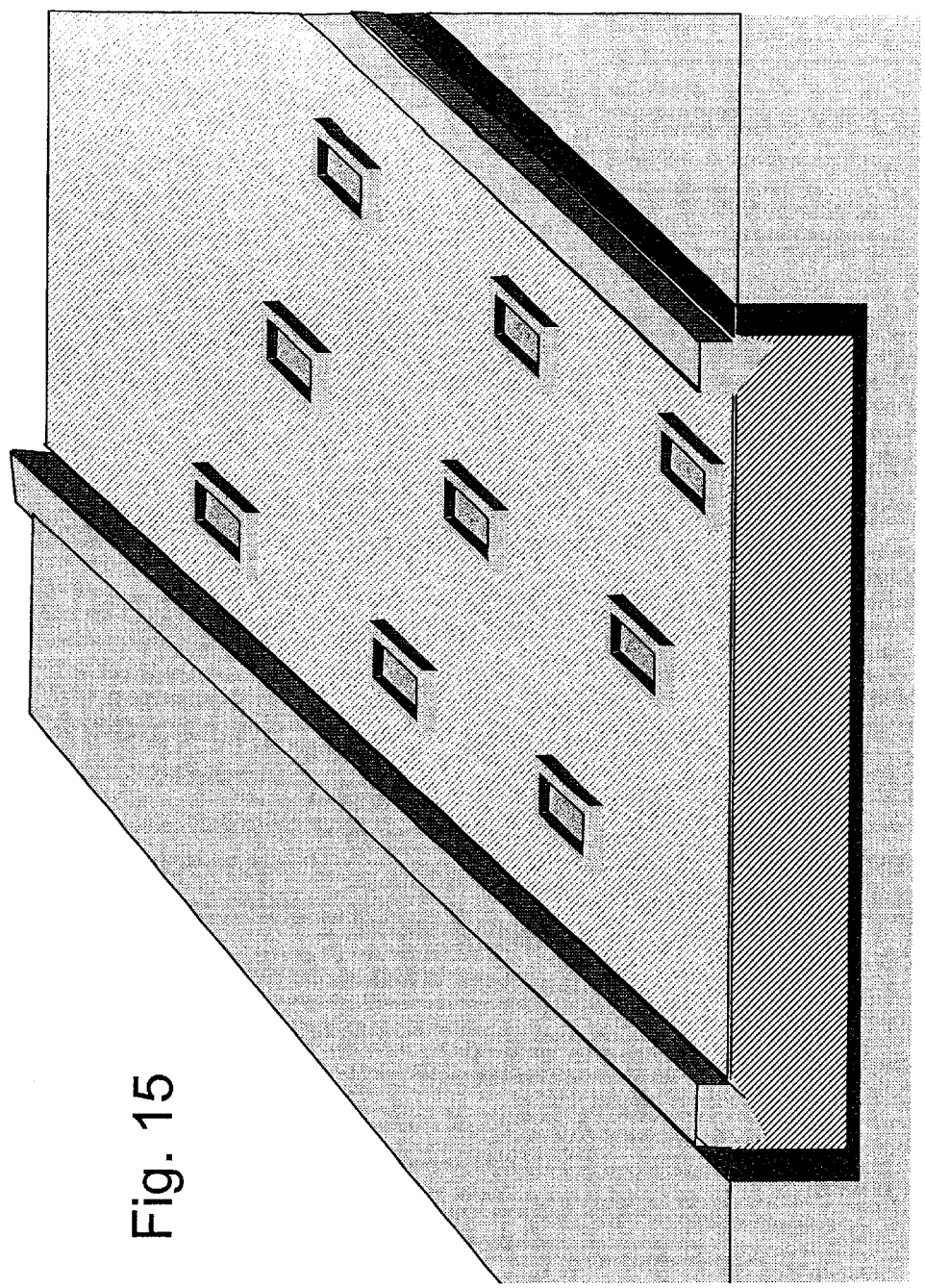
FIG. 15 shows a perspective cross-section of the structure in FIG. 14.

FIG. 14 illustrates a MEMS configuration wherein additional self-aligned spacers have been incorporated within the main shape, particularly, in large MEMS structures to provide spacing between the edges of such structures. Finally, FIG. 15 shows a perspective cross-section of the same structure. While the invention has been described in terms of a single preferred embodiment, those skilled in the art will recognize that the invention can be practiced with changes and modifications which fall within the spirit and the scope of the appended claims.

Having thus described the invention, what is claimed as new and desired to secure by Letters Patent is as follows:

1. A method of forming a micro-electromechanical switch (MEMS) comprising the steps of:
   a) depositing a first dielectric layer on a substrate, said first dielectric layer having a plurality of conductive interconnect lines formed therein;
   b) wet etching metal to form trenches on the boundaries of said conductive interconnect lines;
   c) depositing a second dielectric layer through which conductive vias are formed, said conductive vias contacting at least one of said plurality of conductive interconnect lines and replicating the trench topographies to the top surface of said second dielectric layer and filling with metal said replicated trench topographies;

d) forming a cavity that is etched-out from said second dielectric layer and having said metal trench topographies selectively inhibit etching the dielectric underneath the metal trench topographies to form self-aligned spacers;

e) filling said cavity with sacrificial material and planarizing said sacrificial material; and f) depositing a third dielectric layer to form a conductive beam with said conductive vias contacting said conductive beam.

2. The method as recited in claim 1, wherein said second dielectric layer conforms to said first dielectric layer and to said conductive interconnect lines.

3. The method as recited in claim 1, wherein said self-aligned spacers have a width ranging from 2000 Å to 1.5 $\mu$m. and a height ranging from 2000 Å to 2 $\mu$m.

4. The method as recited in claim 1, wherein said self-aligned spacers are made of a material that is selected from the group consisting of SiO2, Si3N4 and SiCOH.

5. The method as recited in claim 1, wherein said metal trench topographies are made of copper or of any other platable conductive material.

6. The method as recited in claim 1, wherein step a) further comprises selectively masking said plurality of conductive lines to provide pillars formed within said conductive material to create additional boundaries for placing additional spacers within the perimeter defined by the top surface of said conductive interconnect lines.

7. The method as recited in claim 1, wherein the metal on the surface of said interconnect conductive lines is compatible with the mask RIE'ing.

8. The method as recited in claim 7, wherein metal is left in the replicated trench topographies on the top surface of said second dielectric layer.

9. The method as recited in claim 1, wherein said MEMS device is a capacitive switch wherein the capacitance is partially determined by the height of said self-aligned spacer.

10. The method as recited in claim 1, wherein said capacitive MEMS device is a customizable MEM switch.

11. A micro-electromechanical switch (MEMS) comprising:

a) a first dielectric layer on a substrate, said first dielectric layer having a plurality of conductive interconnect lines formed therein;

b) trenches formed on the boundaries of said conductive interconnect lines;

c) a second dielectric layer through which conductive vias are formed, said conductive vias contacting at least one of said plurality of conductive interconnect lines and trench topographies replicated on the top surface of said second dielectric layer, said trench topographies being filled with metal;

d) a cavity etched-out from said second dielectric layer wherein said metal filled trench topographies selectively inhibit etching the dielectric underneath the metal trench topographies to form self-aligned spacers, said cavity being filled with sacrificial material and planarized; and e) a third dielectric layer with a conductive beam formed therein and contacting said conductive vias.

12. The MEM switch as recited in claim 11, wherein said second dielectric layer conforms to said first dielectric layer and to said conductive interconnect lines.

13. The MEM switch as recited in claim 11, wherein said self-aligned spacers have a width ranging from 2000 Å to 1.5 $\mu$m. and a height ranging from 2000 Å to 2 $\mu$m.

14. The MEM switch as recited in claim 11, wherein said self-aligned spacers are made of a material that is selected from the group consisting of SiO2, Si3N4 and SiCOH.

15. The MEM switch as recited in claim 11, wherein said trenches formed on the boundaries of said conductive interconnect lines are filled with copper or any other platable conductive material.

16. The MEM switch as recited in claim 11, wherein step a) further comprises selectively masking said plurality of conductive lines to provide pillars formed within said conductive material to create additional boundaries for placing additional spacers within the perimeter defined by the top surface of said conductive interconnect lines.

17. The MEM switch as recited in claim 11, wherein said metal is compatible with mask RIE'ing.

18. The MEM switch as recited in claim 17, wherein metal is left in the replicated trench topographies on the top surface of said second dielectric layer.

19. The MEM switch as recited in claim 11, wherein said MEMS device is a capacitive switch wherein the capacitance is partially determined by the height of said self-aligned spacer.

20. The MEM switch as recited in claim 11, wherein said capacitive MEMS device is a customizable MEM switch.

* * * * *